(12) United States Patent
Schweitzer, III et al.

(10) Patent No.: US 10,656,198 B2
(45) Date of Patent: *May 19, 2020

(54) ELECTRIC POWER SYSTEM MONITORING USING HIGH-FREQUENCY SIGNALS

(71) Applicant: Schweitzer Engineering Laboratories, Inc., Pullman, WA (US)

(72) Inventors: Edmund O. Schweitzer, III, Pullman, WA (US); Veselin Skendzic, Schwenksville, PA (US); Cody W. Tews, Pullman, WA (US); David E. Whitehead, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,211

(22) Filed: Dec. 27, 2018

(65) Prior Publication Data

US 2019/0339321 A1 Nov. 7, 2019

Related U.S. Application Data

(63) Continuation of application No. 15/292,890, filed on Oct. 13, 2016, now Pat. No. 10,180,451.

(60) Provisional application No. 62/240,605, filed on Oct. 13, 2015.

(51) Int. Cl.
*G01R 31/11* (2006.01)
*G01R 31/08* (2020.01)
*G01R 19/00* (2006.01)

(52) U.S. Cl.
CPC .......... *G01R 31/11* (2013.01); *G01R 19/0084* (2013.01); *G01R 31/086* (2013.01); *G01R 31/088* (2013.01)

(58) Field of Classification Search
CPC .............................. G01R 31/11; G01R 31/086
See application file for complete search history.

(56) References Cited

U.S. PATENT DOCUMENTS

| | | | |
|---|---|---|---|
| 4,063,162 | A | 12/1977 | Lanz |
| 4,165,482 | A | 8/1979 | Gale |
| 4,251,770 | A | 2/1981 | Schweitzer |
| 4,371,907 | A | 2/1983 | Bignell |
| 4,475,079 | A | 10/1984 | Gale |

(Continued)

FOREIGN PATENT DOCUMENTS

KR 100999575 12/2010

OTHER PUBLICATIONS

Europe Patent Application 16856211.4, European Extended Search Report, dated May 21, 2019.

*Primary Examiner* — Christopher P McAndrew
*Assistant Examiner* — Zannatul Ferdous
(74) *Attorney, Agent, or Firm* — Jared L. Cherry; Richard M. Edge

(57) ABSTRACT

A system for monitoring an electric power delivery system by obtaining high-frequency electric power system measurements and displaying event information is disclosed herein. The system may use the high-frequency electric power system information to detect traveling waves. The system may generate a display showing fault location on the electric power system, and timing of traveling waves received at locations on the electric power system. The display may include time on one axis and location on another axis. The display may include a waterfall display.

20 Claims, 12 Drawing Sheets

(56) References Cited

U.S. PATENT DOCUMENTS

| | | | |
|---|---|---|---|
| 4,499,417 A | 2/1985 | Wright | |
| 4,500,834 A | 2/1985 | Ko | |
| 4,618,933 A | 10/1986 | Vitins | |
| 4,825,326 A | 4/1989 | Andow | |
| 5,083,086 A | 1/1992 | Steiner | |
| 5,481,195 A | 1/1996 | Meyer | |
| 5,729,144 A | 3/1998 | Cummins | |
| 6,222,711 B1 | 4/2001 | Hori | |
| 6,597,180 B1 | 7/2003 | Takaoka | |
| 6,944,554 B2 | 9/2005 | Kim | |
| 7,119,546 B2 | 10/2006 | Cautereels | |
| 8,315,827 B2 | 11/2012 | Faybisovich | |
| 8,502,542 B2 | 8/2013 | Couture | |
| 10,090,664 B2 | 10/2018 | Schweitzer | |
| 10,180,451 B2 * | 1/2019 | Schweitzer, III | G01R 31/086 |
| 10,310,004 B2 | 6/2019 | Schweitzer | |
| 10,310,005 B2 | 6/2019 | Schweitzer | |
| 2006/0198065 A1 | 9/2006 | Guzman-Casillas | |
| 2007/0041137 A1 | 2/2007 | Thompson | |
| 2008/0143344 A1 | 6/2008 | Focia | |
| 2009/0231769 A1 | 9/2009 | Fischer | |
| 2010/0002348 A1 | 1/2010 | Donolo | |
| 2011/0063761 A1 | 3/2011 | Kasztenny | |
| 2011/0264388 A1 * | 10/2011 | Gong | G01R 31/086 702/58 |
| 2011/0264389 A1 * | 10/2011 | Mynam | G01R 31/086 702/58 |
| 2012/0182657 A1 | 7/2012 | Narendra | |
| 2013/0021039 A1 | 1/2013 | Bjorklund | |
| 2013/0096854 A1 | 4/2013 | Schweitzer | |
| 2014/0049264 A1 * | 2/2014 | Ganesh | G01R 31/025 324/551 |
| 2015/0081234 A1 | 3/2015 | Schweitzer | |
| 2015/0255978 A1 | 9/2015 | Chen | |
| 2016/0187406 A1 | 6/2016 | Liu | |
| 2016/0266192 A1 | 9/2016 | Burek | |
| 2017/0356965 A1 | 12/2017 | Guzman-Casillas | |
| 2017/0358913 A1 | 12/2017 | Kasztenny | |
| 2018/0034265 A1 | 2/2018 | Naidu | |
| 2018/0083437 A1 | 3/2018 | Schweitzer | |
| 2018/0292448 A1 | 10/2018 | Schweitzer | |
| 2018/0301894 A1 | 10/2018 | Ha | |

\* cited by examiner

ELECTRIC POWER SYSTEM MONITORING USING HIGH-FREQUENCY SIGNALS

RELATED APPLICATION

The present application claims priority as a continuation application to U.S. patent application Ser. No. 15/292,890, filed on 13 Oct. 2016, titled "ELECTRIC POWER SYSTEM MONITORING USING HIGH-FREQUENCY SIGNALS", which claims priority under 35 U.S.C. § 119(e) to U.S. Provisional Patent Application No. 62/240,605, filed Oct. 13, 2015, titled "WATERFALL DISPLAY OF TIME-DOMAIN ELECTRIC POWER SYSTEM EVENTS," which are hereby incorporated by reference in their entireties.

TECHNICAL FIELD

This disclosure relates to systems and methods for obtaining and analyzing high-frequency electric power system measurements. More particularly, this disclosure relates to obtaining high-frequency electric power system measurements, correlating measurements from local and remote locations on the electric power system, and analyzing such measurements to assess high-frequency signals generated within the electric power system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
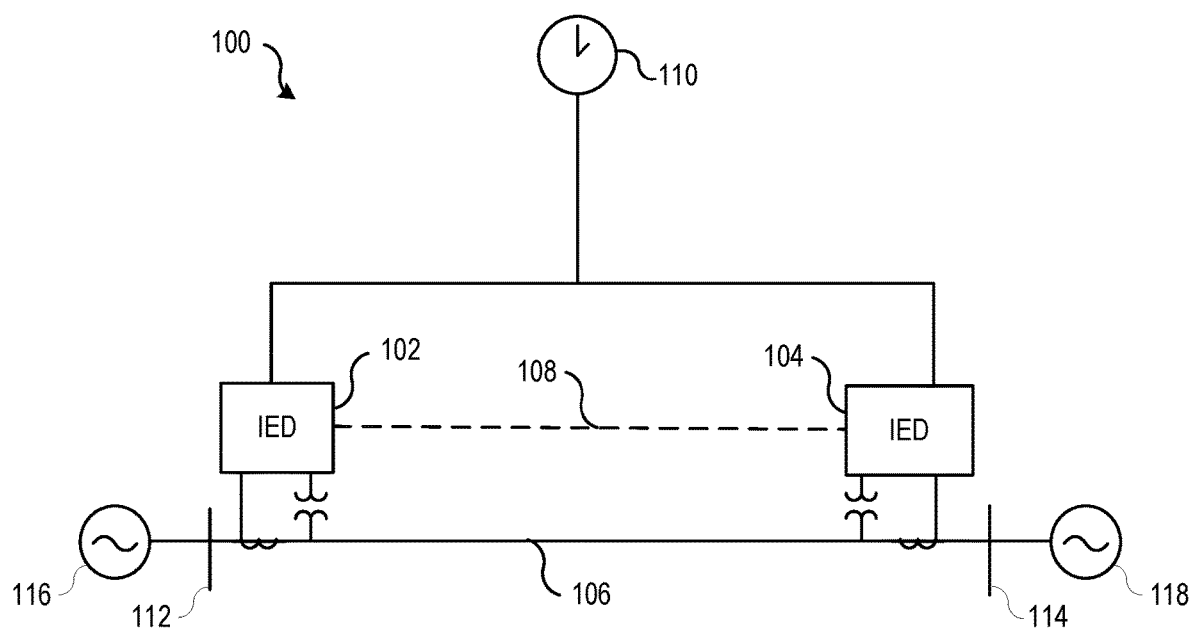
FIG. 1 illustrates a block diagram of a system for detecting and calculating a location of a source of a high-frequency signal in an electric power system.

Various embodiments of the present disclosure pertain to systems and methods for acquiring and analyzing high-speed; high-resolution data that may be used to improve the operation of an electric power delivery. Such improvements may take a variety of forms consistent with the present disclosure, including, the ability to identify and locate high-frequency signal sources within the electric power delivery system. High-frequency signals may be generated by various sources or actions, including faults, partial discharge activity, areas of high corona discharge, and/or equipment operation (e.g., breakers operating, capacitor banks switching, voltage tap changes, etc.). Systems and methods consistent with the present disclosure may analyze measurements of high-frequency signals to determine the location of the source and to determine an appropriate response. For example, where the high-frequency signal source corresponds to a fault, the response may be tripping a breaker to clear the fault. In another example, the high-frequency signal may correspond to partial discharge activity, and the response may be providing an indication that maintenance is needed to address the issue before an insulator failure occurs.

Faster transmission line protection improves power system stability. If faults are not cleared before the critical fault clearing time, the system may lose transient stability and possibly suffer a black out. In addition, faster fault clearing increases the amount of power that can be transferred. Faster protection also enhances public and utility personnel safety, limits equipment wear, improves power quality, and reduces property damage. Various embodiments consistent with the present disclosure may utilize high-speed data measurements to identify traveling waves launched by faults in an electric power system.

Fault detection based on traveling waves may decrease the time necessary to clear a fault. Most protection principles are based on the fundamental frequency components of voltages and currents. Accurate measurement of a sinusoidal quantity typically takes a cycle. To increase the speed of protection actions, an analysis of transient components may be undertaken in connection with various embodiments of the present disclosure.

High-speed protection devices respond to high-frequency signal components, which may be used to detect faults and to realize other advantages. For example, certain nontraditional energy sources, such as wind and solar, are connected to the power system through a power electronics interface.

As such, these sources typically have little or no inertia. Their control algorithms protect the converters for network fault conditions. As a result, these sources produce voltages and currents that challenge some protection principles developed for networks with synchronous generators. In contrast, high-speed protection devices configured to respond to high-frequency signal components are less dependent on the sources and more dependent on the network itself. As a result, such relays may be useful in applications near non-traditional sources.

Various embodiments consistent with the present disclosure may analyze traveling waves (TWs) to aid in the detection of faults. When a fault occurs in an electric power system, traveling waves are launched from the fault and travel outward at a velocity near the speed of light. The traveling waves are reflected by buses and other discontinuities according to their corresponding characteristic impedances. Accordingly, the traveling waves may be described by the propagation velocity, the reflection and transmission coefficients, and the line characteristic impedance. Using a traveling wave detection algorithm, a high-speed relay may be able to detect a fault and initiate corrective action in less than 1 millisecond consistent with certain embodiments of the present disclosure.

Further, high-frequency information relating to electrical conditions may also be utilized to assess and maintain a power system. In one particular application, the systems and methods disclosed herein may be used to monitor a transmission line for damage caused by partial discharge across insulators. Partial discharge activity destroys the insulator surface and may lead to insulator failure over time. Partial discharge activity generates high frequency signals. The high-frequency signals generated by partial discharge activity are small and are attenuated with distance. Most of the VHF and UHF energy associated with partial discharge activity is radiated locally and does not propagate along the transmission line corridor. The signal components of partial discharge at lower frequencies (e.g., <5 MHz), may propagate along the transmission line with lower losses, and may eventually reach substation terminals. In various embodiments consistent with the present disclosure, these signal components may be identified and analyzed to identify the location of partial discharge activity and/or areas where insulator failure is likely.

Corona discharge may also generate high frequency signals on a transmission line. Corona discharge represents a loss, and in some circumstances a significant loss in the power transmitted through an electric power system. Corona discharge may be affected by various conditions, including the voltage level, conductor diameter, weather, etc. Corona discharge may be distributed across the length of a transmission line; however, certain areas may exhibit higher levels of corona discharge. Identification of areas of higher levels of corona discharge may be a first step toward remediation of the issues causing the additional amount of corona discharge. Various systems and methods consistent with the present disclosure may utilize various techniques to separate the signal associated with corona discharge from the signal associated with insulator partial discharge activity. In one particular embodiment, corona discharge may be identified and analyzed using a correlation based waterfall display consistent with the present disclosure.

In various embodiments, systems and methods consistent with the present disclosure may utilize high-frequency electric power system information to generate representations of conditions in the electric power system that may useful in identifying potential problems before an equipment failure occurs. For example, an identification of an area of a power system suffering from damage due to partial discharge activity may enable remedial action to be taken before an insulator failure. Similarly, an identification of an area of abnormal corona discharge may enable corrective action that reduces the power lost due to such discharge. In various embodiments, systems and methods consistent with the present disclosure may generate a display based on high-frequency electric power system information. Such displays may, among other things, identify the location of sources of high-frequency signal in an electric power system (e.g., faults, areas of partial discharge activity, areas of high corona discharge, etc.).

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be illustrated as software modules or components. In other embodiments, hardware-implemented embodiments may be used. Such embodiments may utilize, among other technologies, field-programmable gate arrays. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates a block diagram of a system 100 for detecting and calculating a location of a source of a high-frequency signal in an electric power system. System 100 may include generation, transmission, distribution and/or similar systems. System 100 includes a conductor 106 such as a transmission line connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by IEDs 102 and 104 at two locations of the system, although additional IEDs may also be utilized to monitor other locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs), potential transformers (PTs), Rogowski coils, voltage dividers and/or the like. IEDs 102, 104 may be capable of using inputs from conventional instrument transformers such as CTs and PTs conventionally used in the monitoring of an electric power delivery system. IEDs 102 and 104 may also receive common time information from a common time source 110.

Common time source 110 may be any time source capable of delivering a common time signal to each of IEDs 102 and 104. In various embodiments, common time source 110 may be a Global Navigation Satellite System ("GNSS"). Examples of GNSS systems include the Global Positioning System ("GPS"), the GLObal NAvigation Satellite System (GLONASS), and the Galileo Satellite System. GNSS systems may be used by multiple devices and applications distributed across large areas, and may avoid the need for costly high-accuracy time sources in multiple locations. In addition to GNSS, common time source 110 may be embodied using an IRIG system, a WWVB or WWV system, a network-based system, such as the IEEE 1588 precision time protocol, and/or the like. According to one embodiment, common time source 110 may comprise a satellite-synchronized clock (e.g., Model No. SEL-2407, available from Schweitzer Engineering Laboratories of Pullman Wash.). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, traveling wave direction, traveling wave polarity, time-domain incremental quantity based fault direction, and other measurements reflecting electrical conditions on conductor 106, such as voltages, currents, time-domain fault detection, and fault location. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data.

In several embodiments herein, traveling waves on the electric power delivery system may be used to detect and calculate the location of a fault. Two-end fault locating methods, which may be referred to herein as Type D methods, may use a time difference between a traveling wave captured at both terminals along with the line length and wave propagation velocity to compute the fault location. Measurement devices at the line terminals detect the traveling waves and time stamp the arrival of the wave using a common time reference (e.g., IRIG-B or IEEE 1588). In certain embodiments, a distance to a fault location (m) is calculated using Eq. 1.

$$m = \frac{1}{2}[L + (t_L - t_R) \cdot v]$$ Eq. 1 where: $t_L$ is the front wave arrival time at the L Terminal,
$t_R$ is the front wave arrival time at the R Terminal,
v is the wave propagation speed,
L is the line length.

Traditionally these solutions use a master station that accesses the wave arrival times and estimates the fault location. Recently, line relays equipped with traveling wave fault locating function may exchange the wave arrival times, calculate the fault location, and make the fault location available at the relay. One of the key benefits of using the Type D method is its simplicity and immunity to reflections.

Figure 2A:
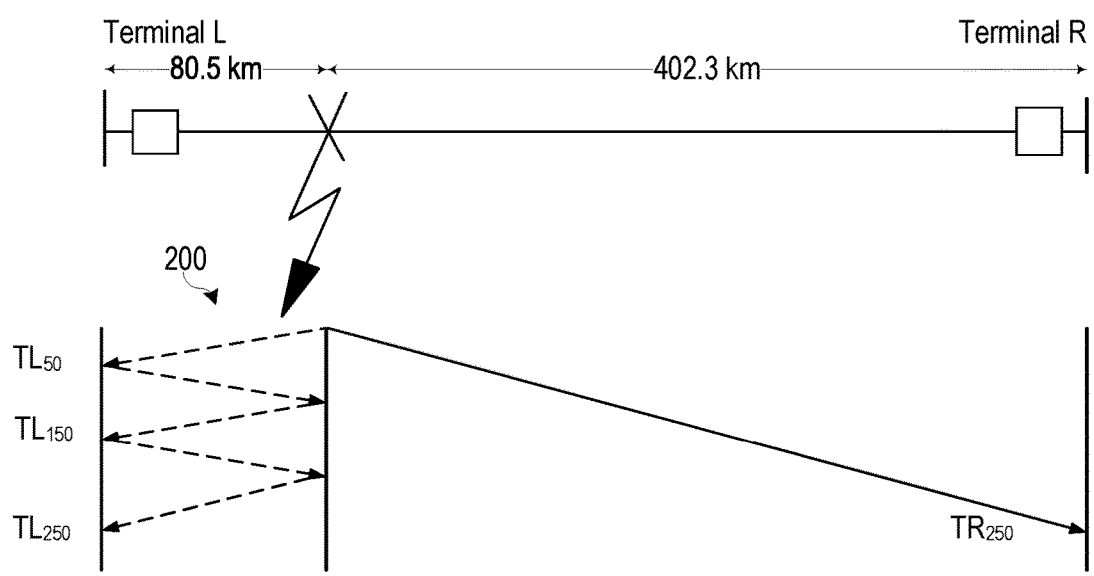
FIG. 2A illustrates a lattice diagram showing incident and reflected traveling waves over a relative time scale created by a fault event on a 300 mile (482.8 km) long transmission line consistent with certain embodiments of the present disclosure.

FIG. 2A illustrates a lattice diagram 200 showing incident and reflected traveling waves created by a fault consistent with certain embodiments of the present disclosure. In the illustrated embodiment, a fault is located 50 miles (80.5 km) from a first terminal on a 300 mile (482.8 km) long line. The incident wave launched by the fault reaches the Terminal L at time $TL_{50}$, and reaches the Terminal R at time $TR_{250}$. The Type D method may use the $TL_{50}$ and $TR_{250}$ to compute the fault location while ignoring all the other waves. When desired, remaining wave arrivals can be used to improve the initial fault location estimate.

Figure 2B:
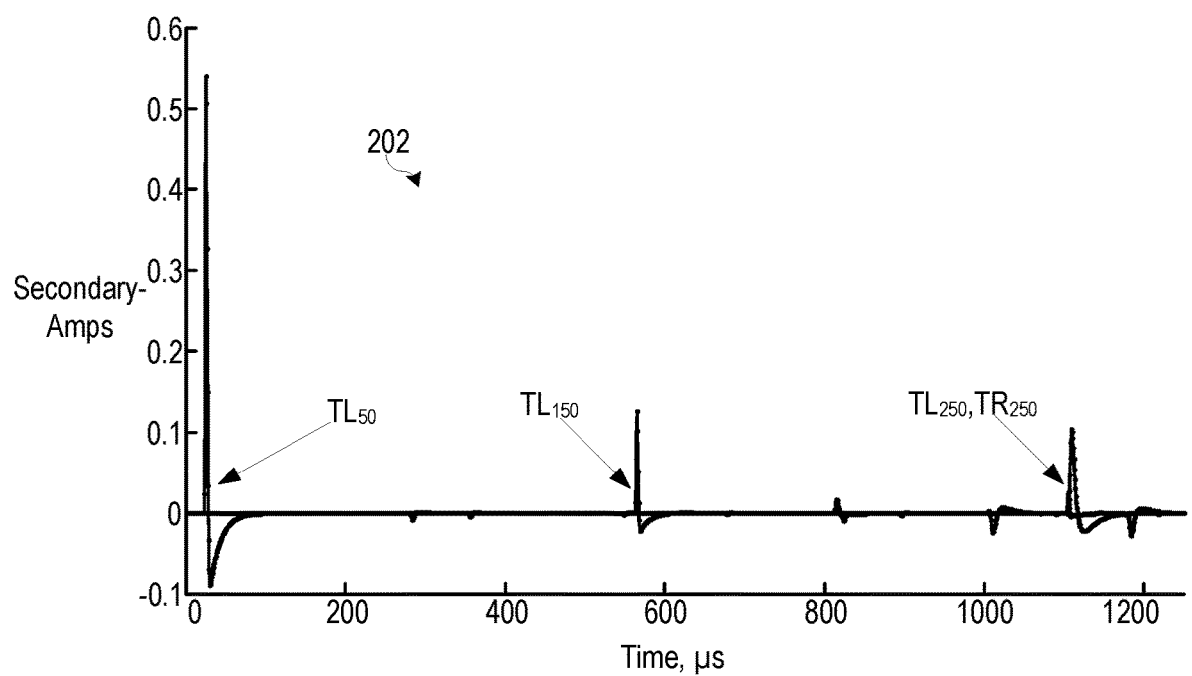
FIG. 2B illustrates the incident and reflected traveling waves as a function of current over time from the fault illustrated in FIG. 2A consistent with certain embodiments of the present disclosure.

FIG. 2B illustrates the incident and reflected traveling waves as a function of current over time 202 from the fault illustrated in FIG. 2A consistent with certain embodiments of the present disclosure. As illustrated, the magnitude of the reflected traveling waves diminishes with each reflection. Time alignment of data samples received at both Terminal L and Terminal R allows for comparison of the incident and reflected waves from both terminals.

A single-end fault locating method, which is also referred to herein as a Type A fault locating method, uses the time difference between the first arrived traveling wave and a subsequent reflection from the fault or the remote terminal. The Type A method is not dependent on a communication channel to the remote terminal. However, the challenge is to identify and select the appropriate reflection. The Type A method may be useful, according to some embodiments, when the fault location is computed during reclosing events on a permanent fault when one of the terminals is open.

FIG. 2B illustrates the reflections from the fault at terminal L. The polarity, amplitude, and arrival time of the reflected waves can be used to identify the reflected wave from the fault or the remote terminal and calculate the fault location. At the L Terminal, the Type A method may use points labeled $TL_{50}$ and $TL_{150}$ in FIG. 2B to compute the fault location while ignoring other waves and reflections. In certain embodiments, a distance to a fault location (m) may be calculated using the Type A method using Eq. 2.

$$m = \left(\frac{t_{L2} - t_{L1}}{2}\right) \cdot v \qquad \text{Eq. 2}$$

where: $t_{L2}$ is the arrival time of the first reflection from the fault at the L Terminal;
$t_{L1}$ is the arrival time of the initial wave front from the fault at the L Terminal; and
v is the wave propagation speed.

In various embodiments, the polarity of the traveling wave may be used to determine the direction to the fault. Voltage and current polarities are opposite if the fault is in the forward direction. If the fault is in the reverse direction, the voltage and current traveling waves have the same polarity.

Figure 2C:
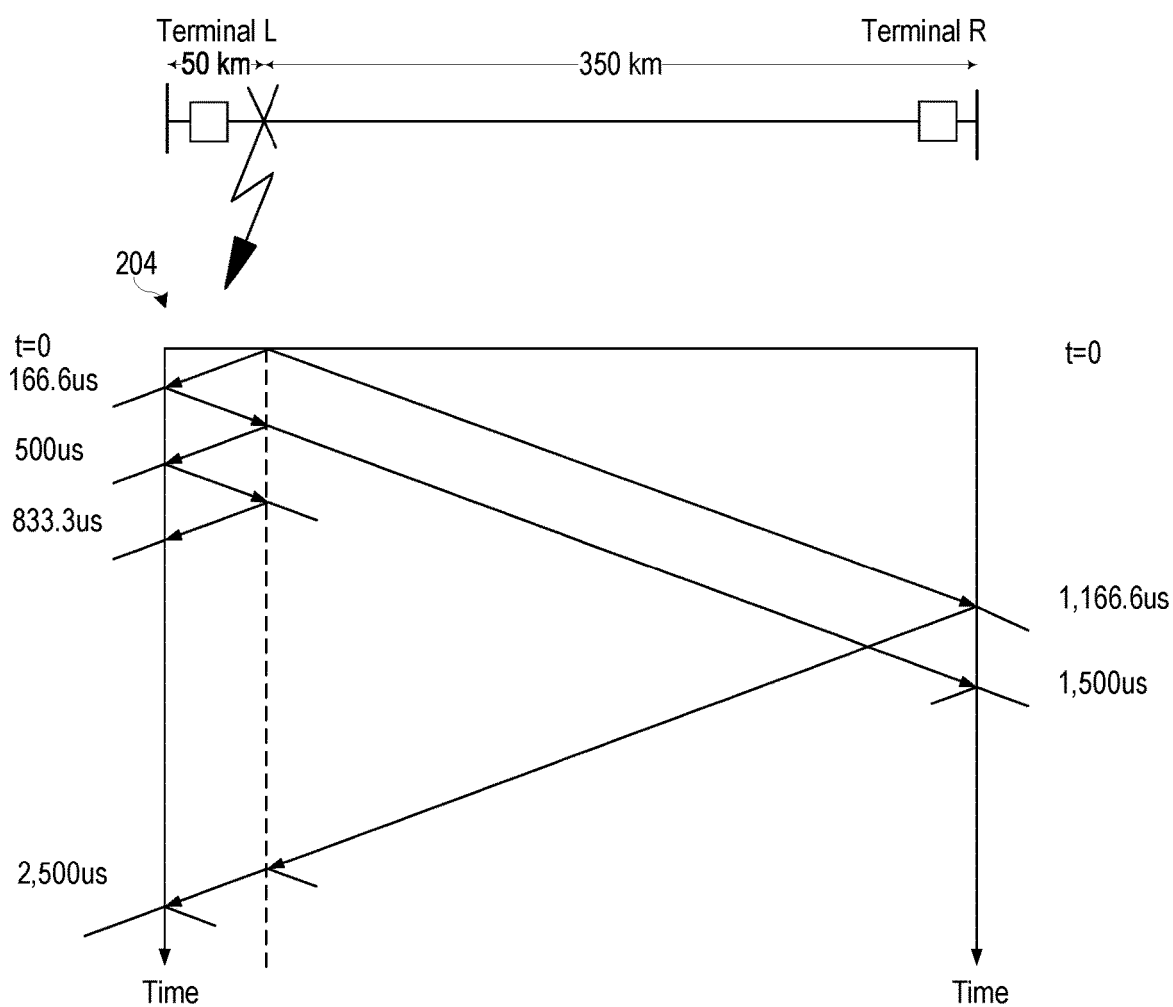
FIG. 2C illustrates a lattice or waterfall diagram showing the incident and reflected traveling waves at a remote terminal and a local terminal from a fault event on a 400 km long transmission line consistent with certain embodiments of the present disclosure.

FIG. 2C illustrates a lattice diagram 204 showing the incident and reflected traveling waves at a remote terminal and a local terminal from a fault event on a 400 km long transmission line consistent with certain embodiments of the present disclosure. Assuming a $3 \times 10^8$ m/s propagation velocity, a fault located at 50 km on a 400 km line would result in a time lag between the initial front-wave and the first legitimate reflection from the fault that may be calculated using Eq. 3.

$$\frac{2 \times 50 \times 10^3}{3 \times 10^8} = 333 \, \mu s \qquad \text{Eq. 3}$$

Further, knowing that the line is 400 km long, it is possible to obtain a delay time estimate for the first wave reflected from the remote terminal. With respect to the instant of fault occurrence, the first reflection from the remote terminal will be per Eq. 4.

$$\frac{(2*400 - 50)*10^3}{3*10^8} = 2,500 \, \mu s \qquad \text{Eq. 4}$$

As illustrated in FIG. 2C, a local relay generates measurement with respect to the first arriving wave, which is 166.6 µs, because of the 50 km distance between the local relay and the fault. The estimate determined using Eq. 4 may provide a window in which a reflected wave may be expected after the initial front wave.

While the previously described two-ended and single-ended traveling wave fault location methods provided a more accurate estimate of the location of the fault than was available using, for example, impedance-based methods, these methods were constrained due to communication system limitations and reliance on frequency-domain measurements. In the frequency domain, measurements of electric power system voltage and current require a full electric power system cycle to calculate with adequate accuracy. Thus, previous fault detection and location algorithms could not determine a location of a fault faster than one electric power system cycle, for most faults.

The time-domain electric power system fault detection and location techniques described herein do not require a complete electric power system cycle to calculate measurements of voltage or current. Conventional PTs and CTs may be used to provide signals corresponding to the voltage and current of the electric power delivery system, which may be used for fault detection and location calculations in less than one electric power system cycle.

Although FIG. 1 and FIGS. 2A-2C specifically address location of faults using traveling waves, the same principles may be applied to locating other sources of high-frequency events on an electric transmission line. For example, the point designated as the fault in FIG. 2A, may represent another type of source of high-frequency signals in an electric power system, such as a partial discharge activity location. The high-frequency signal generated by the partial discharge activity may be received at Terminal L and Terminal R. The signals received at Terminal L and Terminal R may be analyzed and used to determine a location of the source of the signals.

Figure 3:
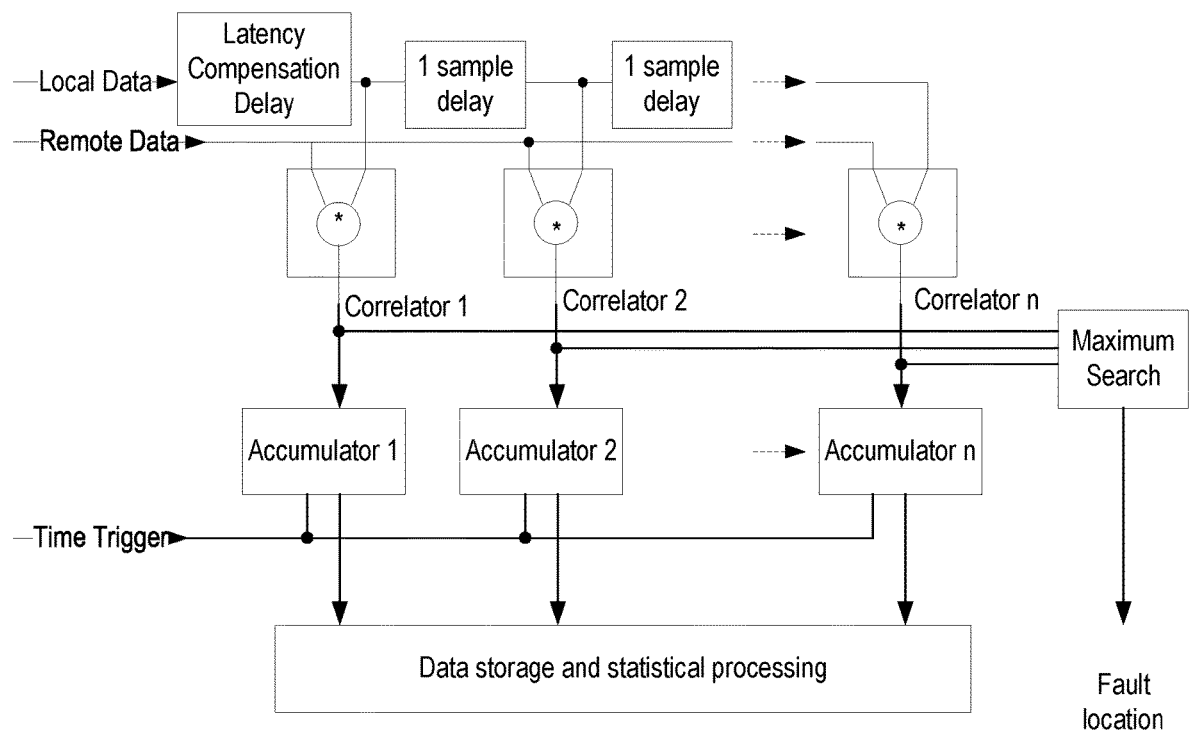
FIG. 3 illustrates a block diagram of a system configured to use a correlation technique for determining a fault location consistent with certain embodiments of the present disclosure.

FIG. 3 illustrates a block diagram of a system configured to use a correlation technique for determining a fault location consistent with certain embodiments of the present disclosure. In the embodiment illustrated in FIG. 3, a traveling wave differential module may use multiplication instead of signal addition. This technique may be referred to herein as a correlation technique.

Correlation calculations can be performed once upon detection of the traveling wave signal or other high-frequency signal, or alternatively, correlation calculations may be performed continuously for every input signal sample. A correlator output may further be filtered by averaging a number of output results (samples) with filter length adjusted to encompass single wave peaks. Operation of the correlator may further be modified to search for the time delay P; using P as the unknown variable and performing calculations for all time delays in the range P≤T (all delays lower than the line propagation delay T).

The correlation technique can also be applied to continuous monitoring of the transmission line health. In this approach, the transmission line is subdivided into a number of segments with a separate correlator assigned to each segment as shown in FIG. 3. One objective of such an approach is to detect any energy that may be originating from a particular line segment. This energy may include excessive corona discharge, partial insulation breakdown and localized insulator arcing that may be present before the fault, and lightning strikes in the immediate vicinity of the line. Line activity may be monitored continuously to identify high-frequency signals originating in each segment accumulated over a selectable time period as commanded by the Time Trigger signal (for example 1 second to 24 hours). Accumulated data is subsequently stored for further statistical analysis and alarming purposes.

As illustrated in FIG. 3, individual correlators are fed by two signals. The remotely measured signal (current or voltage for a given phase) may be obtained through communications and a delayed version of the locally measured signal on the same phase may each be provided to an individual correlator. Each correlator may receive a different delay such that the signals generated on a given segment on the transmission line are lined up to the selected correlator inputs regardless of the fact they are measured on different ends of the transmission line.

Any number of correlators (observed line segments) may be linked to the sampling frequency used to perform measurements at the two ends of the line. For example, with a sampling frequency set to 1 MHz, and the known propagating speed of the traveling wave signals (close to the speed of light c=299.8e6 m/s), the traveling wave will travel 299.8 m (shown as 300 m herein) between two consecutive samples. The propagation delay for a particular medium may be determined and utilized in various embodiments. For example, the propagation delay may differ between overhead transmission lines verses underground transmission lines, with underground transmission lines having a slower propagation speed. Systems and methods consistent with the present disclosure may account for different propagation speeds in different media. If the correlator delays are set one sample (1 μs) apart, spatial resolution becomes equal to one half of the travel time 300 m/2=150 m. The number of correlators required to cover the entire line length can be calculated according to Eq. 5.

$$n = 2*L*\frac{fs}{c}$$ Eq. 5 where:
n is the number of correlators.
L is the line length
c is the traveling wave propagating speed which is close to the speed of light
fs is the sampling frequency FIG. 3 also shows a real time "Maximum Search" component preferably running at the correlator rate (i.e. 1 MHz). This component is tasked with finding the highest correlator output in real time, and reporting it as a possible fault location candidate. Since each correlator is associated with a particular segment of the line; highest output associated with the traveling wave arrival directly identifies a location of the power system fault that caused the traveling wave or area of excessive energy discharge.

In various embodiments, the sampling frequency may be adjusted (higher or lower than 1 MHz), with the total number of correlators selected to meet the desired spatial resolution. Individual correlators can be assigned to individual transmission line phases (A,B,C) multiplying the total number of correlators required to cover the line by 3.

Figure 4A:
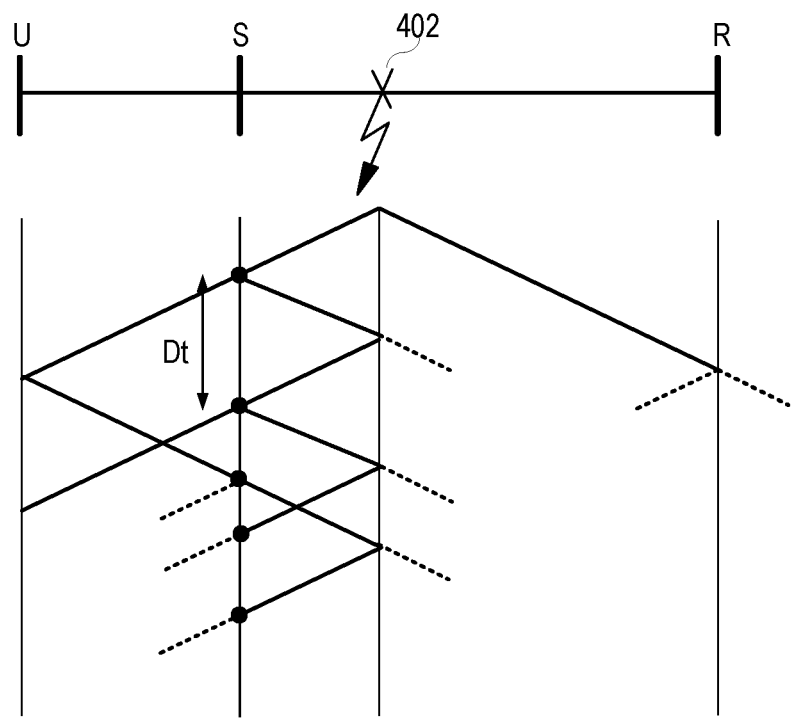
FIG. 4A illustrates TWs launched by a fault and reflected at locations U, S, and R consistent with certain embodiments of the present disclosure.

FIG. 4A illustrates TWs launched by a fault 402 and reflected at locations U, S, and R consistent with certain embodiments of the present disclosure. The TW launched by the fault is reflected at the relay location S, is reflected again at the fault point 402, and returns to location S. An underreaching TW distance element may be designed by measuring the time difference Δt between the arrival of the first TW from the fault and the arrival of the TW reflected at the fault point. The element calculates the fault distance using Δt and the wave propagation velocity and issues a trip if the distance is shorter than the set reach.

In one embodiment, the distance to the fault may be calculated and an appropriate control action may be initiated using the following steps. First, upon arrival of the first TW to the line terminal, a fault detection system determines the fault direction using a directional element, as disclosed herein. For faults in the forward direction, an estimate Δt may be determined between the two TWs, as shown in FIG. 4A. Further, a system may use cross-correlation to verify similarity of the wave reflected from the fault and the prior wave traveling toward the fault. Third, the system may calculate the distance to the fault using Eq. 6.

$$d = \frac{\Delta t}{2} \cdot v$$ Eq. 6

Fourth, if d is less than a reach setting, a control action may be initiated to clear the fault.

Figure 4B:
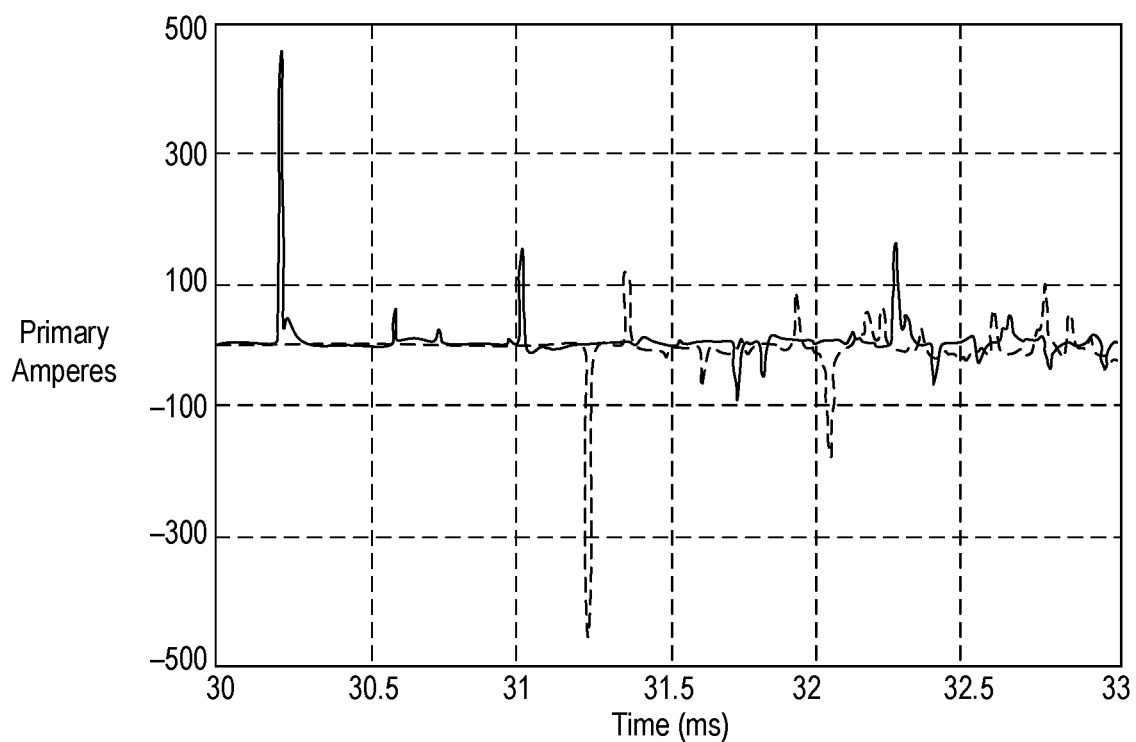
FIG. 4B illustrates a plot over time of traveling wave currents received at Terminal S and Terminal R in FIG. 4A during an external fault consistent with certain embodiments of the present disclosure.

FIG. 4B illustrates a plot over time of traveling wave currents received at Terminal S and Terminal R in FIG. 4A during an external fault consistent with certain embodiments of the present disclosure. In FIG. 4B the Terminal S signal (solid line) and Terminal R signal (dashed line) illustrate the B-phase alpha current (B-phase current minus a zero-sequence current). The TWs illustrated in these figures may be obtained using a differentiator-smoother filter having a window length of 20 microseconds. The current TW entered the protected line at the local terminal at 30.20 milliseconds with a value of around +462 A and left the line at the remote terminal at 31.23 milliseconds with a value of around −464 A. The operating signal calculated is approximately 2 A. The restraining signal is approximately 926 A. The restraining signal (926 A) is much greater than the operating signal (2 A), therefore, the element would be restrained and the element restrains as expected.

In various embodiments, information collected over time relating to the high-frequency signals on a transmission line (e.g., signals generated by corona discharge and/or partial discharge activity) may be utilized in connection with a fault location system. For example, the expected signal levels may be used to identify potential points on a transmission line corresponding to known discontinuities that may cause reflections of a traveling wave.

Figure 5:
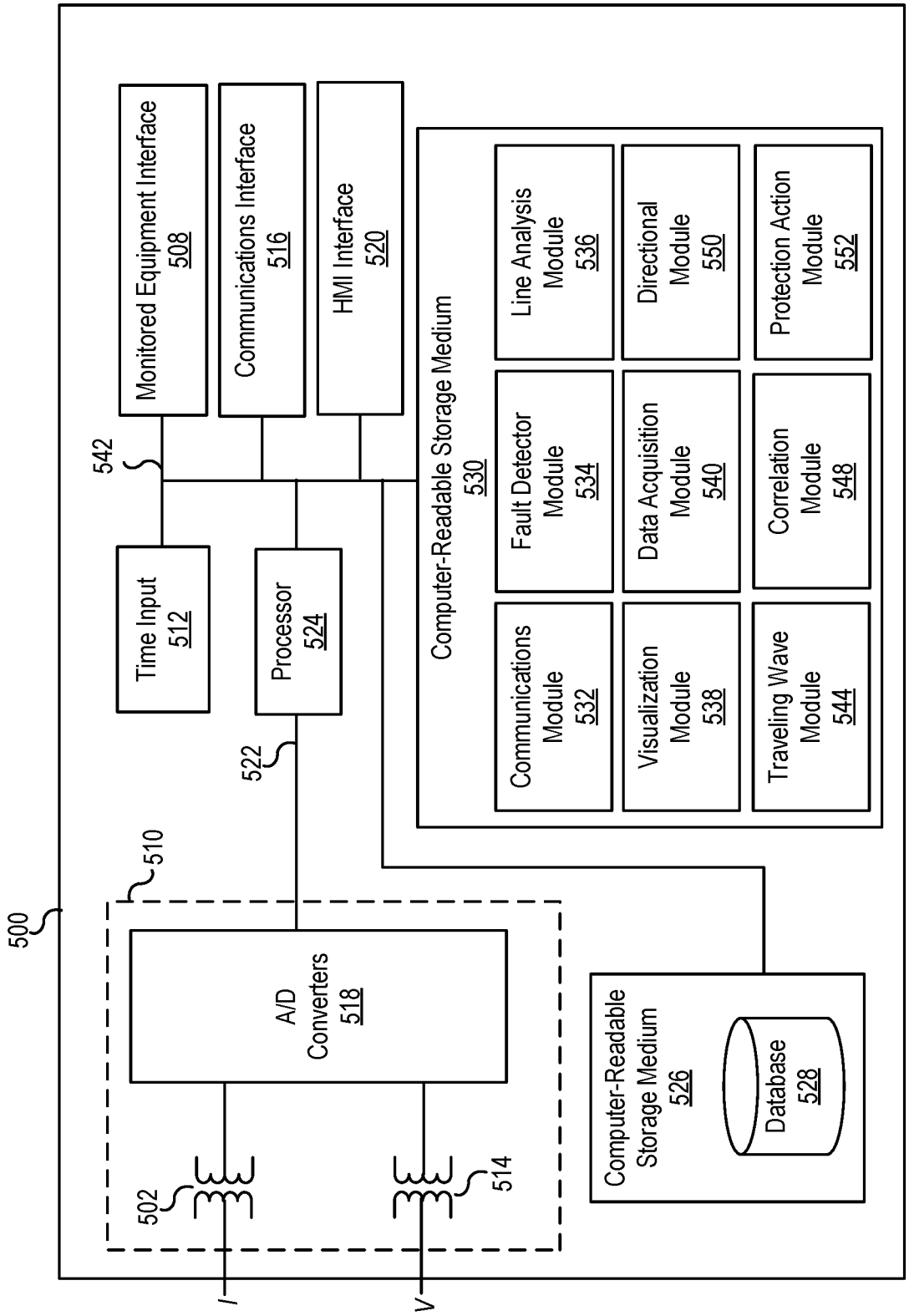
FIG. 5 illustrates a functional block diagram of a system configured to obtain and analyze high-speed and high-resolution data in an electrical system consistent with embodiments of the present disclosure.

FIG. 5 illustrates a functional block diagram of a system 500 configured to obtain and analyze high-speed and high-resolution data in an electrical system consistent with embodiments of the present disclosure. In certain embodiments, the system 500 may comprise an IED system configured to, among other things, obtain, analyze, and calculate time-domain quantities; detect and locate faults using a time-domain distance module; detect and locate faults using a time-domain directional module; detect and locate faults using traveling waves; and analyze a transmission line for high-frequency signals attributable to partial discharge activity and corona emissions. System 500 may be implemented using hardware, software, firmware, and/or any combination thereof. In some embodiments, system 500 may be embodied as an IED, while in other embodiments, certain components or functions described herein may be associated with other devices or performed by other devices. The specifically illustrated configuration is merely representative of one embodiment consistent with the present disclosure.

System 500 includes a communications interface 516 configured to communicate with devices and/or IEDs. In certain embodiments, the communications interface 516 may facilitate direct communication with other IEDs or communicate with systems over a communications network. Communications interface 516 may facilitate communications through a network. A human-machine interface (HMI)

520 may further include an interface to a local display, local computer, network display, network computer, or the like. A data bus 542 may enable communication among the components of system 500.

System 500 may further include a time input 512, which may be used to receive a time signal (e.g., a common time reference) allowing system 500 to apply a time-stamp to the acquired samples. In certain embodiments, a common time reference may be received via communications interface 516, and accordingly, a separate time input may not be required for time-stamping and/or synchronization operations. One such embodiment may employ the IEEE 1588 protocol. A monitored equipment interface 508 may be configured to receive status information from, and issue control instructions to, a piece of monitored equipment (such as a circuit breaker, conductor, transformer, or the like).

Processor 524 may be configured to process communications received via communications interface 516, time input 512, and/or monitored equipment interface 508. Processor 524 may operate using any number of processing rates and architectures. Processor 524 may be configured to perform various algorithms and calculations described herein. Processor 524 may be embodied as a general purpose integrated circuit, an application specific integrated circuit, a field-programmable gate array, and/or any other suitable programmable logic device.

In certain embodiments, system 500 may include a sensor component 510. In the illustrated embodiment, sensor component 510 is configured to gather data directly from electric power system equipment, such as a conductor (not shown) using PTs and/or CTs. The sensor component 510 may use, for example, transformers 502 and 514 and A/D converters 518 that may sample and/or digitize filtered waveforms to form corresponding digitized current and voltage signals provided to data bus 522. Current (I) and voltage (V) inputs may be secondary inputs from conventional instrument transformers such as, CTs and VTs. A/D converters 518 may include a single A/D converter or separate A/D converters for each incoming signal. A current signal may include separate current signals from each phase of a three-phase electric power system. A/D converters 518 may be connected to processor 524 by way of data bus 522, through which digitized representations of current and voltage signals may be transmitted to processor 524.

A computer-readable storage medium 526 may be the repository of a database 528 containing electric power line properties for each transmission line and/or each section of each transmission line, such as impedances, resistances, propagation times, reactances, lengths, energy discharge, and/or the like. Another computer-readable storage medium 530 may be the repository of various software modules configured to perform any of the methods described herein. A data bus 542 may link monitored equipment interface 508, time input 512, communications interface 516, and computer-readable storage mediums 526 and 530 to processor 524.

Computer-readable storage mediums 526 and 530 may be separate mediums, as illustrated in FIG. 5, or may be the same medium (i.e. the same disk, the same non-volatile memory device, or the like). Further, the database 528 may be stored in a computer-readable storage medium that is not part of the system 500, but that is accessible to system 500 using, for example, communications interface 516.

Communications module 532 may be configured to allow system 500 to communicate with any of a variety of external devices via communications interface 516. Communications module 532 may be configured for communication using a variety of data communication protocols (e.g., UDP over Ethernet, IEC 61800, etc.).

Data acquisition module 540 may collect data samples such as the current and voltage quantities. The data samples may be associated with a timestamp and made available for retrieval and/or transmission to a remote IED via communications interface 516. High-frequency signals (e.g., traveling waves, signals associated with partial discharge activity, corona discharge, etc.) may be measured and recorded in real-time, since they are transient signals that dissipate rapidly in an electric power delivery system. Data acquisition module 540 may operate in conjunction with fault detector module 534 and line analysis module 536 to identify a process data reflecting high-frequency signals. Such processing may include processing by fault detector module 534, which may be configured to determine the occurrence of a fault with an electric power distribution system. Further, such processing may include analysis of a transmission line by line analysis module 536 to identify areas affected by partial discharge activity, corona discharge, and the like.

Line analysis module 536 may be configured to analyze high-frequency, high-resolution data time domain data reflecting electrical conditions in the electric power distribution system. Such analysis may identify signals indicative of partial discharge activity, corona discharge, and the like. In various embodiments, line analysis module 536 may utilize statistical information stored in database 528 to differentiate between signal components attributable to partial discharge activity and corona discharge. For example, the statistical information may be used to represent a nominal noise floor associated with a particular transmission line. Further, the statistical information may include representations of various types of equipment operation (e.g., tap changes, breakers opening, etc.) and may be used to differentiate such operation from other sources of high-frequency signals. In various embodiments, the line analysis module 536 may be configured to identify certain areas of a transmission line for inspection and/or maintenance.

A visualization module 538 may be configured to display representations of the analysis of the fault detector module 534, the line analysis module 536, the traveling wave module 544, and the like. In some embodiments, a waterfall display may be utilized to represent characteristics of transmission lines determined by line analysis module 536. The waterfall display may comprise a two-dimensional or a three-dimensional representation of electrical conditions. In embodiments utilizing a two-dimensional representation, the length of the transmission line may be reflected on one axis, time may be reflect on another axis, and magnitude may be illustrated using a color scheme. In embodiments utilizing a three-dimensional representation, the length of the transmission line may be reflected on one axis, time may be reflected on another axis, and magnitude may be reflected on the third axis. Such displays may aid in the identification of particular areas of a transmission line that are the source of high-frequency signals and that may correspond to areas of high corona discharge or partial discharge activity.

A traveling wave module 544 may detect a traveling wave. Further, the traveling wave module 544 may be configured to determine a control operation to take in response to the traveling wave. As discussed above, traveling waves may be launched by faults that occur in an electric power system. Analysis of the traveling wave may provide information about the location or source of the traveling wave and the type of event that gave rise to the traveling wave.

A correlation module 548 may be configured to receive local and remote incremental quantities, and to correlate them. The correlation may be done by time alignment using time stamps.

A directional module 550 may be configured to determine a direction (forward or reverse) to a fault. In some embodiments, directional module 550 may be configured to determine the direction based on the polarity of traveling waves. In such embodiments, the polarities of the voltage and current traveling waves are opposite if the fault is in the forward direction. If the fault is in the reverse direction, the voltage and current traveling waves have the same polarity.

A protective action module 552 may be configured to implement a protective action based on the declaration of a fault by the fault detector module 534. In various embodiments, a protective action may include tripping a breaker, selectively isolating a portion of the electric power system, etc. In various embodiments, the protective action module 552 may coordinate protective actions with other devices in communication with system 500.

In various embodiments system 500 may be configured to provide protection based on instantaneous voltages and currents. Such signal components require shorter data windows but facilitate faster protection. Various embodiments of system 500 may be configured to achieve an operating time of approximately 1 millisecond. Such a system may utilize a lumped parameter circuit-based and TW-based time-domain approach and may allow for versatile applications covering various relay input voltage sources and available communications channels. Such a system may utilize high sampling rates (≥1 MHz), high-resolution (≥16 bits) synchronized sampling, high-fidelity time synchronization, and a communications network capable of exchanging all acquired data (≥100 Mbps), or high numeric burden required by some of the algorithms (≥1 G multiplications per second).

Figure 6:
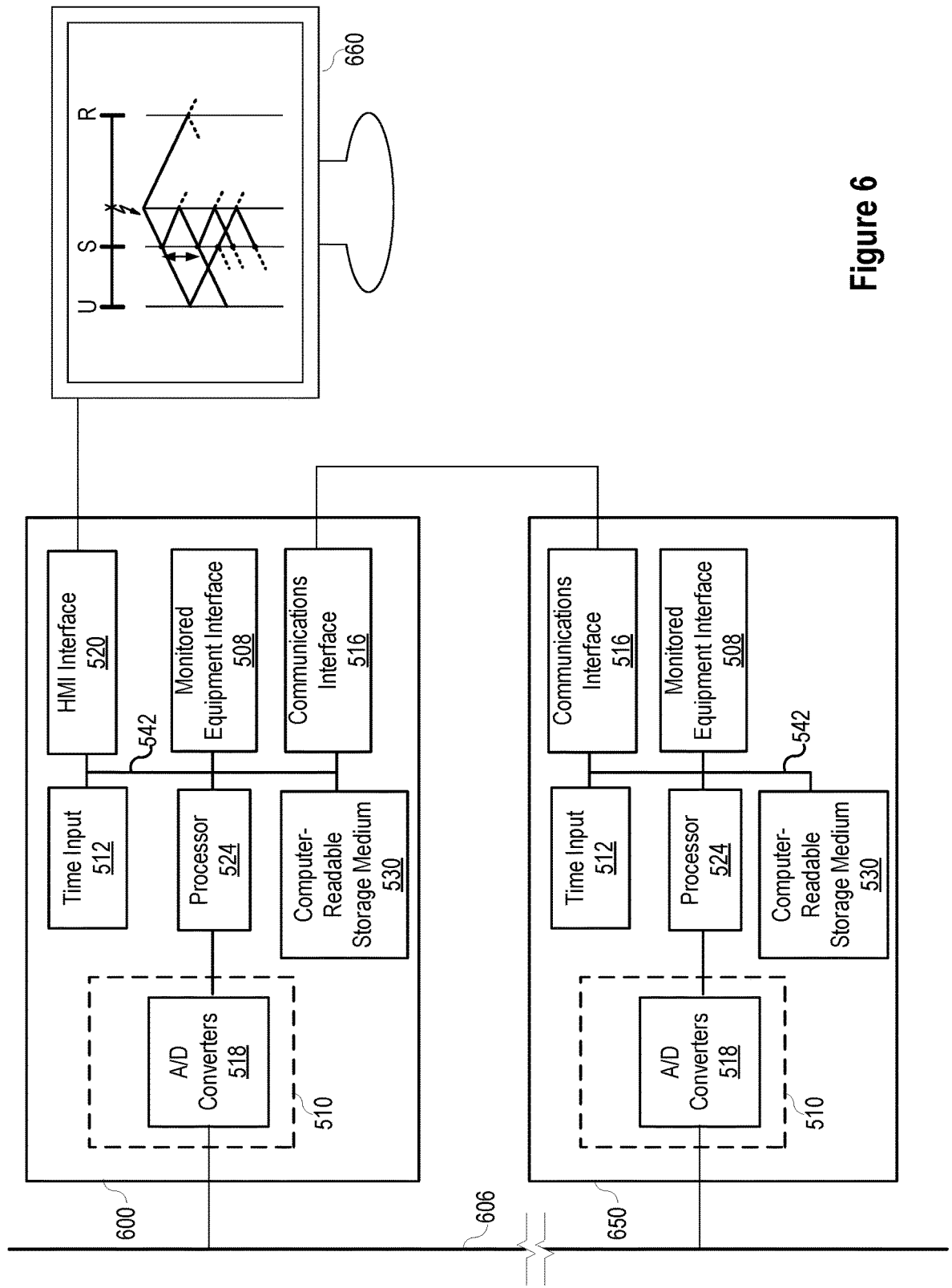
FIG. 6 illustrates a system for obtaining high frequency electric power system measurements from a local and a remote terminal and analyzing the measurements to identify high-frequency signals in an electric power system consistent with embodiments of the present disclosure.

FIG. 6 illustrates a system for obtaining high frequency electric power system measurements from a local and a remote terminal and analyzing the measurements to identify high-frequency signals in an electric power system consistent with embodiments of the present disclosure. The system may include a local IED 600 and a remote IED 650. Local and remote IEDs 600, 650 may be similar to the system disclosed in FIG. 5, although the block diagrams of the IEDs 600 and 650 as illustrated in FIG. 6 are simplified. Local and remote IEDs 600, 650 may be in electrical communication with a transmission line 606, and may be configured to obtain high-frequency current and/or voltage measurements therefrom. IEDs 600 650 may analyze the high-frequency current and/or voltage measurements to identify, locate, and classify sources of high-frequency signals, such as faults, partial discharge activity, and/or excessive corona discharge. IEDs 600 and 650 may be in communication with each other via communications interface 516 such that IEDs 600 and 650 may share high-frequency electric power system information, event information, and correlation information.

IED 600 may be configured to generate a display of the electric power system information using the high-frequency electric power system measurements, even information from the local and remote locations, and correlation information. An HMI 520 may be in communication with a display 660 to generate a representation of the information. In various embodiments, the display 660 may comprise a local monitor, a monitor via a computer device, a remote monitor, a network monitor, or the like. In one embodiment, the display may comprise include a recommendation or report relating to maintenance based on the location of a high-frequency signal sources on conductor 606. Such high frequency sources may correspond to areas of partial discharge activity or excessive corona discharge.

Figure 7:
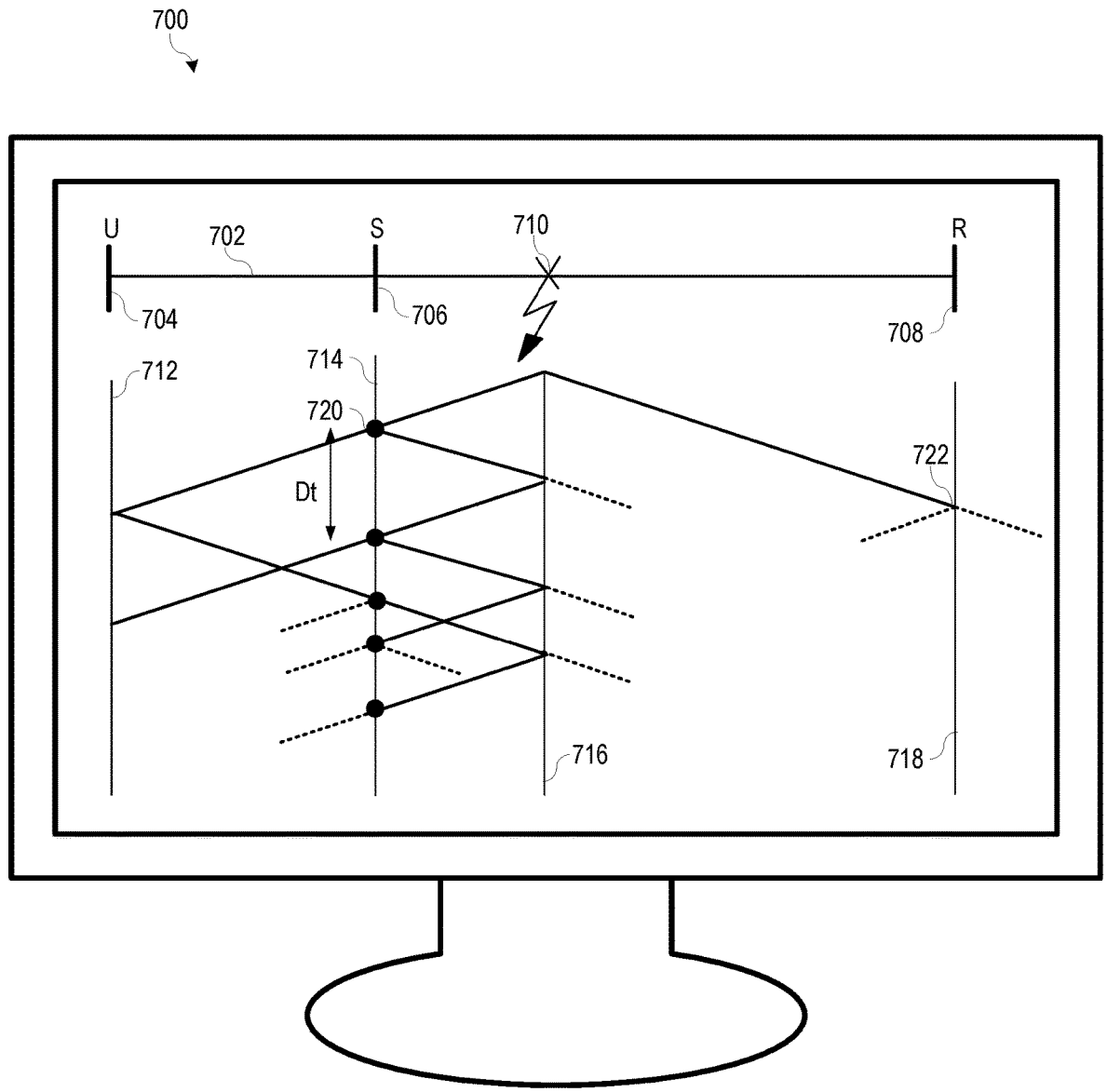
FIG. 7 illustrates a display of traveling wave and time domain events from local and remote sources of high-frequency electric power system measurements consistent with certain embodiments of the present disclosure.

FIG. 7 illustrates a display 700 of traveling wave and time domain events from local and remote sources of high-frequency electric power system measurements consistent with certain embodiments of the present disclosure. The display 700 may include a simplified representation of the electric power delivery system including a transmission line 702, the local location 706 (location of local IED 600), remote location 708, and a bus 704 behind the local location 706. The display may further include a representation of the location of a fault 710, and a representation of the events associated with the fault 710. The representation may be in the form or a waterfall display showing representations of the physical features of the electric power system such as for example, bus U 712, local location 714, remote location 718, and fault location 716.

Display 700 comprises a two-dimensional representation in which the length of the transmission line is represented on the X-axis and time is represented on the Y-axis. Time progresses from the top of the display to the bottom of the display. Events detected and correlated may be displayed as they occur over time (vertical axis of the display) and on the electric power system (horizontal axis). For example, upon occurrence of the fault at location 710, the traveling wave thereof is first detected at the local location 706 at time 720, later detected at remote location 708 at time 722. Display 700 may illustrate the fault at location 710 thereof on the line 702, time and location of the arrival of the traveling wave 720 at the local location 706, time and location of the arrival of the traveling wave 722 at remote location 708, and various reflections and subsequent traveling wave detections. Display 700 may further include a time between the reception of the traveling wave at the local location, $D_t$.

Figure 8:
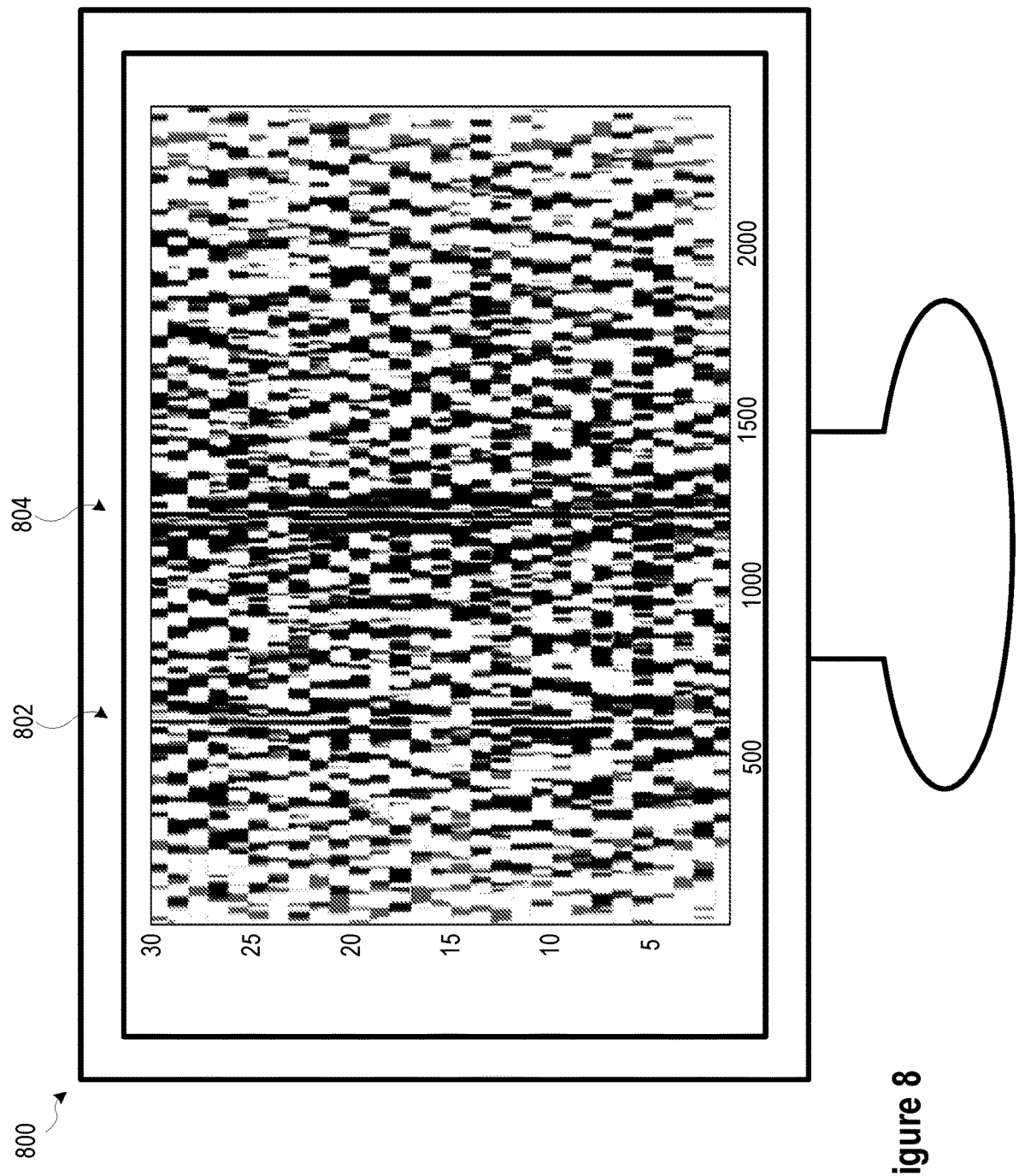
FIG. 8 illustrates a display configured to represent high-frequency electric power system measurements consistent with certain embodiments of the present disclosure.

FIG. 8 illustrates a display 800 configured to represent high-frequency electric power system measurements consistent with certain embodiments of the present disclosure. As discussed above, a variety of electric power system events may trigger traveling waves or signals that may be detected using high-frequency measurements. For example, flashover or smaller arcing events may be launched traveling waves that may be detected. Such events may be displayed using a waterfall display 800. The waterfall display 800 includes distance on the X-axis and time along the Y-axis. In the illustrated embodiment, two areas 802, 804 may correspond to a high-frequency source. The sources remain constant over time (i.e., along the Y-axis), and at constant distances of approximately 550 and 1200 meters. In some embodiments, the intensity of the events may be identified using a color scheme. Using a waterfall display 800, the location of repeating arcing events may be determined, even in the situation where such arcing events may not result in a fault or be detected using fault detection operations. The time axis may be modified to include more or less time, or be recorded at varying increments.

Figure 9A:
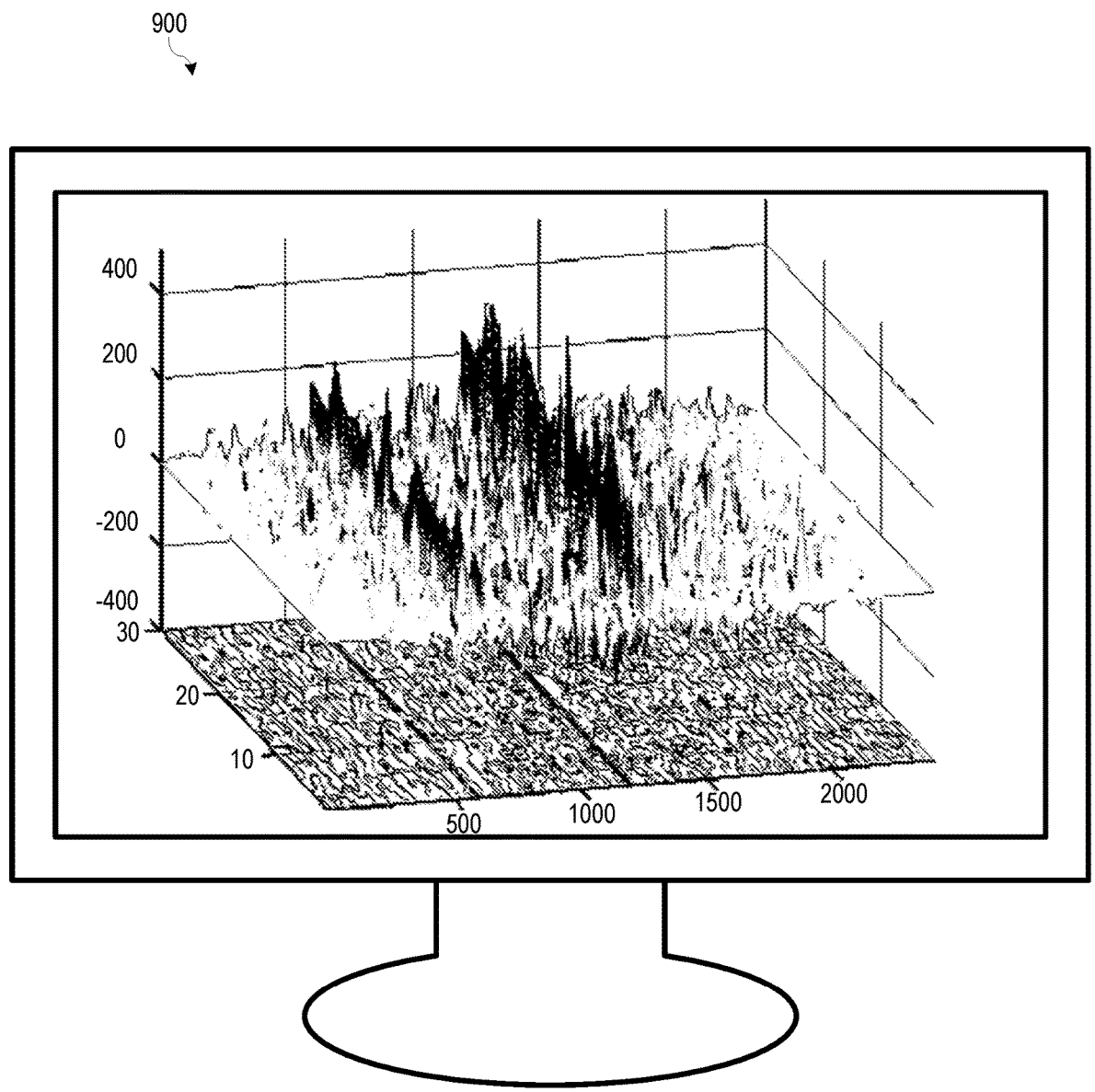
FIG. 9A illustrates a three-dimensional display configured to represent high-frequency electric power system measurements consistent with certain embodiments of the present disclosure.

FIG. 9A illustrates a three-dimensional display configured to represent high-frequency electric power system measurements consistent with certain embodiments of the present disclosure. The display 900 may include distance on a first axis, where distance is in length of a power line or the like. Distance may be on the X-axis, with time on another axis such as the Y-axis. A third axis may include a representation of the strength of the signal corresponding with the event. Signal strength is illustrated on the Z-axis of display 900. As can be seen, a repeated event during the time illustrated at around location 1200 is evident. Further, a lower-strength signal indicates a repeated event periodically during the illustrated time at around location 550.

Figure 9B:
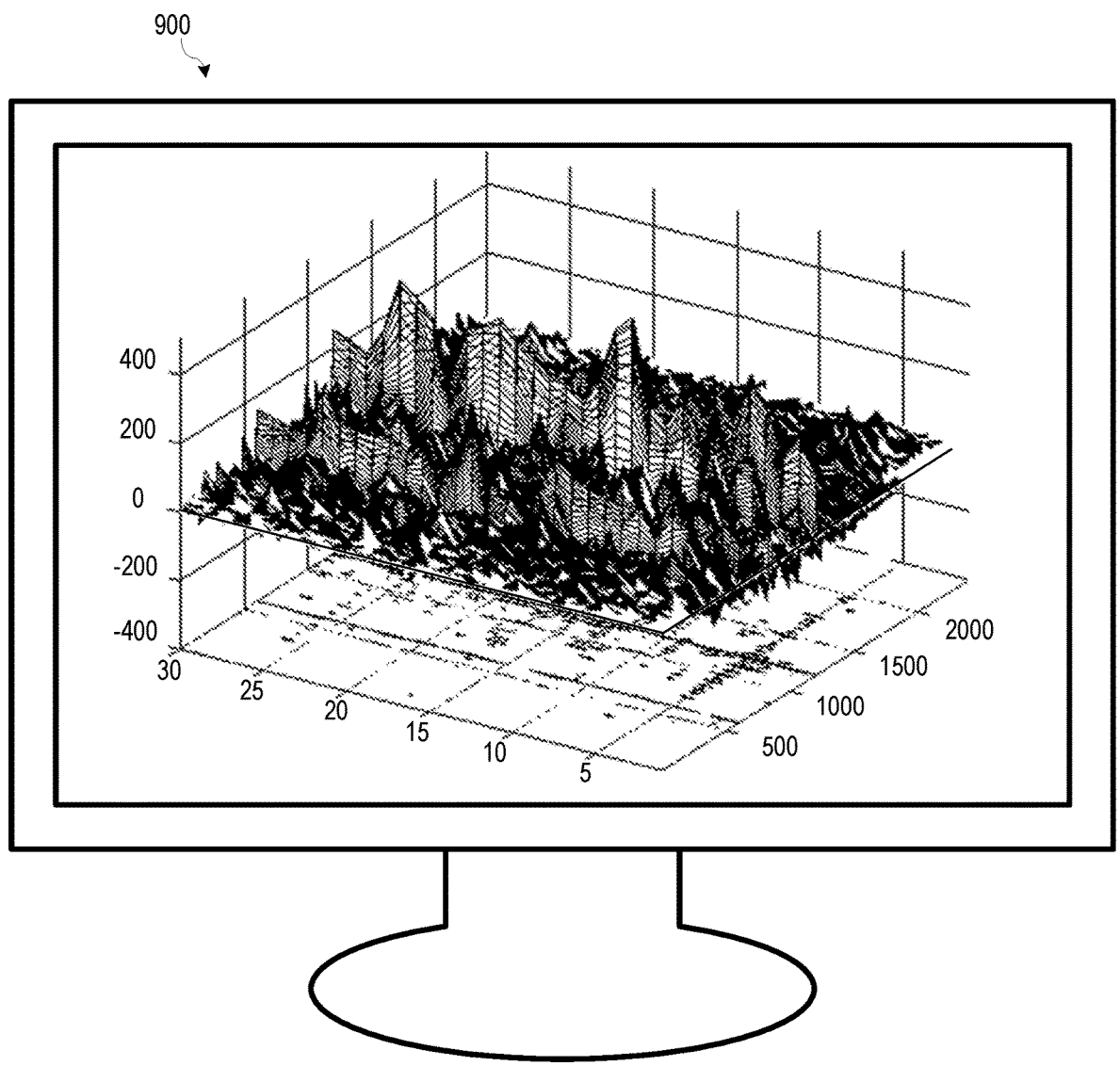
FIG. 9B illustrates a view from a second perspective of the three-dimensional display illustrated in FIG. 9A.

FIG. 9B illustrates a view from a second perspective of the three-dimensional display illustrated in FIG. 9A. In various embodiments, a color scheme may be used to provide information about the strength of a signal or other parameter.

Various kinds of events may be detected and displayed using the apparatuses and methods disclosed herein. In particular, sources of high-frequency signals in a power system may be detected and displayed as disclosed herein, regardless of whether the event would be determined as a fault event according to the protection algorithms of the fault detectors and fault location calculators disclosed herein. For example, the event may be an arcing event, partial discharge, flashover, fault, or the like.

Figure 10:
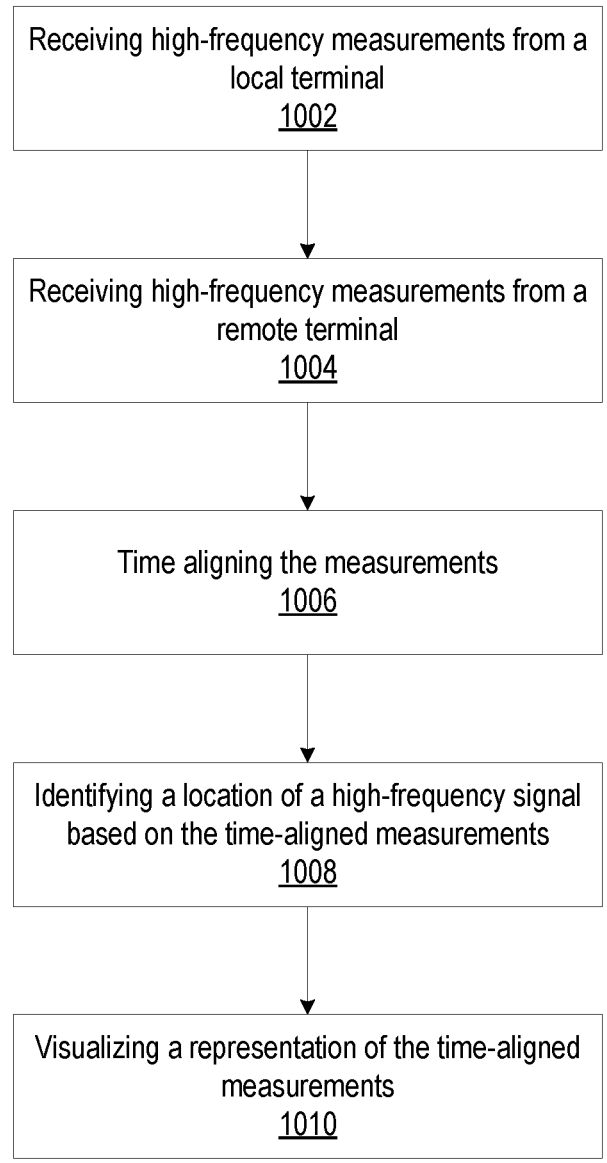
FIG. 10 illustrates a flow chart of method for monitoring an electric power delivery system consistent with embodiments of the present disclosure.

FIG. 10 illustrates a flow chart of method for monitoring an electric power delivery system consistent with embodiments of the present disclosure. At 1002, a plurality of high frequency measurements may be received from a local terminal. In various embodiments, a system such as system 500, illustrated in FIG. 5, may be used to receive the measurements from the local terminal. At 1004, a plurality of high frequency measurements may be received from a remote terminal. Again, a system such as system 500, illustrated in FIG. 5, may be used to receive the measurements from the remote terminal.

At 1006, the measurements from the local terminal and the remote terminal may be time aligned. In various embodiments, a common time source may be used to align the measurements, such as a GNSS system. In some embodiments, the time signal may be transmitted using a network time protocol.

At 1008, a location of a high-frequency signal may be identified based on the time-aligned measurements. In various embodiments, the high-frequency signal may correspond to a fault, an area of excessive corona discharge, an area of partial discharge activity, etc.

At 1010, a visualization of the time-aligned measurements may be generated. In various embodiments, the representation may comprise a two-dimensional or a three-dimensional representation. A representation, such as the two-dimensional representation illustrated in FIG. 8, or the three-dimensional representation illustrated in FIG. 9A and FIG. 9B.

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied. In other embodiments, the principles taught may be applied to a direct-current electric power delivery system. In particular, traveling wave detection using currents only in a traveling wave differential module may use current quantities from a direct-current electric power delivery system to detect faults and take control actions thereon.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system to detect a location of a high-frequency signal source in an electric power delivery system by gathering high-frequency electric power system measurements therefrom, the system comprising:
   a data acquisition module to receive:
      a first plurality of high-frequency electric power system measurements from a local terminal;
      a second plurality of high-frequency electric power system measurements from a remote terminal, the remote terminal being separated from the local terminal by an electric power transmission line in the electric power delivery system;
   a correlation module to time-align the first plurality and the second plurality of high-frequency electric power system measurements; and,
   a visualization subsystem to generate a representation of the time-aligned first plurality and the second plurality of high-frequency electric power system measurements and the location of the high-frequency signal source the location disposed between the local terminal and the remote terminal.

2. The system of claim 1, wherein the time alignment of the first plurality and the second plurality of high-frequency electric power system measurements is based on a common time reference.

3. The system of claim 1, wherein the representation comprises a waterfall display.

4. The system of claim 3, wherein the waterfall display represents a distance along a first axis and a time along a second axis.

5. The system of claim 3, wherein the waterfall display represents a magnitude along a third axis.

6. The system of claim 1, wherein the high-frequency signal source comprises a partial discharge activity across a plurality of insulators.

7. The system of claim 6, further comprising a line analytics module to determine an intensity of the partial discharge at a plurality of locations along a length of the electric transmission line, and the representation reflects the intensity of the partial discharge at the plurality of locations along the length of the electric transmission line.

8. The system of claim 6, further comprising a database of statistical information configured to differentiate a signal component attributable to partial discharge activity and a signal component attributable to a corona discharge.

9. The system of claim 1, wherein the high-frequency signal source comprises a corona discharge.

10. The system of claim 1, further comprising a protective action module configured to implement a protective action based on a determination that the high-frequency signal source comprises a fault.

11. The system of claim 1, further comprising an analysis subsystem to identify a location of a high-frequency signal source based on the time-aligned first plurality and the second plurality of high-frequency electric power system measurements.

12. The system of claim 1, wherein the analysis subsystem comprises a plurality of correlators, each of the plurality of correlators associated with a segment of an electrical transmission line in the electric power delivery system.

13. The system of claim 12, wherein each of the plurality of correlators is configured to receive a first measurement from the first plurality of high-frequency electric power system measurements and a second measurement from the second plurality of high-frequency electric power system measurements.

14. The system of claim 12, wherein the plurality of correlators are each associated with an accumulator actuated by a time trigger.

15. The system of claim 1, wherein the visualization subsystem is further to generate a report relating to maintenance based on the location of the high-frequency signal source.

16. A method of detecting high-frequency signal sources in an electric power delivery system, comprising:
- receiving a first plurality of high-frequency electric power system measurements from a local terminal;
- receiving a second plurality of high-frequency electric power system measurements from a remote terminal, the remote terminal being separated from the local terminal by an electrical power transmission line in the electric power delivery system;
- time-aligning the first plurality and the second plurality of high-frequency electric power system measurements based on a common time reference; and,
- generating a representation of the time-aligned first plurality and the second plurality of high-frequency electric power system measurements and the location of the high-frequency signal source at locations of high-frequency signal sources between the local terminal and the remote terminal.

17. The method of claim 16, further comprising identifying the locations of a high-frequency signal source based on the time-aligned first plurality and the second plurality of high-frequency electric power system measurements.

18. The method of claim 16, further comprising:
- generating a database of statistical information representing a signal component attributable a corona discharge;
- using the database to differentiate a signal component attributable to a partial discharge activity and from the signal component attributable to the corona discharge.

19. The method of claim 16, further comprising:
- determining that the high-frequency signal source comprises a fault, and
- implementing a protective action based on the occurrence of the fault.

20. The method of claim 16, further comprising:
- determining an intensity of the partial discharge at a plurality of locations along a length of an electric transmission line in the electric power delivery system, and
- wherein generating the representation comprises reflecting the intensity of the partial discharge at the plurality of locations along the length of the electric transmission line.

* * * * *